United States Patent [19]
Yamashita

[11] Patent Number: 6,121,075
[45] Date of Patent: Sep. 19, 2000

[54] FABRICATION OF TWO-DIMENSIONALLY ARRAYED QUANTUM DEVICE

[75] Inventor: Ichiro Yamashita, Nara, Japan

[73] Assignee: Matsushita Electric Industrial Co., Ltd., Osaka, Japan

[21] Appl. No.: 09/228,276

[22] Filed: Jan. 11, 1999

Related U.S. Application Data

[62] Division of application No. 09/086,672, May 29, 1998.

[30] Foreign Application Priority Data

May 30, 1997 [JP] Japan ................................ 9-157436

[51] Int. Cl.[7] .................................................. H01L 21/00
[52] U.S. Cl. ........................... 438/149; 438/939; 438/962
[58] Field of Search .............................. 438/99, 142, 149, 438/186, 800, 939, 962; 117/70

[56] References Cited

U.S. PATENT DOCUMENTS 5,281,543   1/1994   Fukuzawa et al. ..................... 438/186
5,412,499   5/1995   Chiu et al. .

FOREIGN PATENT DOCUMENTS 6-120481    4/1994   Japan .
7-202164    8/1995   Japan .
7-263659   10/1995   Japan .
9-135017    5/1997   Japan .

OTHER PUBLICATIONS

Y. Nakamura et al., *Jpn. J. Appl. Phys.*, 35, L1465–L1467 (1996).

K. Yano et al., *Jpn. J. Appl. Phys.*, 63(12), 1248–1250 (1994).

*Primary Examiner*—Charles Bowers
*Assistant Examiner*—Keith Christianson
*Attorney, Agent, or Firm*—Wenderoth, Lind & Ponack, L.L.P.

[57] ABSTRACT

A quantum device is constituted from a two-dimensional array of quantum dots formed from metal atom aggregates contained in metalloprotein complex. The metalloprotein is arranged on the surface of a substrate having an insulation layer with a pitch of the size of the metalloprotein complex. The diameter of the metal atom aggregates used in the quantum device is 7 nm or smaller, and the pitch of the metalloprotein complex is preferably from 11 to 14 nm.

2 Claims, 6 Drawing Sheets

FABRICATION OF TWO-DIMENSIONALLY ARRAYED QUANTUM DEVICE

This application is a divisional of Ser. No. 09/086,672, filed May 29, 1998.

BACKGROUND OF THE INVENTION

1. Field of the Invention

The present invention relates to a quantum device wherein quantum dots are arrayed in two-dimensional configuration. The quantum dots arrayed on the quantum device can be preferably used as single-electron transistor, doping diode, doping transistor, doping transistor array and semiconductor light emitting device.

2. Description of Related Art

Devices that utilize single-electron tunnel effect such as single-electron transistor and single-electron memory are attracting much attention. The single-electron transistor, for example, is a promising candidate that can replace MOSFETs to satisfy the requirements of miniaturization of devices to the order of sub-micron for which improvements on the MOSFETs, the mainstream technology in the field of semiconductor transistor, are reaching limitations thereof A fine particle surrounded by thin insulation layer receives electrons from an external electrode by the tunnel effect. Because the particle has a capacitance C with respect to the outside, electrostatic energy of the particle changes by $e^2/2C$ when an electron enters therein. This prohibits subsequent electron from entering the fine particle by the tunnel effect. Therefore, in order to fabricate the device utilizing the single-electron tunnel effect, it is inevitable to arrange quantum dots on an insulator, the quantum dots being formed from microscopic metal particles having electrostatic energy higher than energy $\Delta E$ (approximately 25 mV) required for thermal excitation of electron at room temperature. In case $e^2/2C$ has a low value, it is inevitable to make an array of quantum dots having energy just above the Fermi level of microscopic dot higher than the thermal excitation level of electron. Although single-electron operation is lost in this case, transistor operation can still be achieved. Also microscopic lead wires must be formed even when a quantum device can be achieved, because the tunnel effect does not occur with wide lead wires of the conventional circuits due to parasitic capacitance accompanying the lead wires.

As a single-electron memory, such a prototype device was made as a fine line (100 nm wide) of polycrystal Si film having an extremely small thickness of 3.4 nm and a gate electrode (100 nm) cross each other via an oxide film gate of 150 nm by depositing a-Si in depressurized CVD process and crystallizing at 750° C. (Japanese Journal of Applied Physics:

Vol.63, No.12, pp.1248, 1994). This device operates at a room temperature and has a potential for the use as an nonvolatile memory which operates at a speed exceeding the limitation of the conventional flash memory. Also an aluminum-based single-electron transistor having an island electrode measuring 20 nm was fabricated by means of electron beam lithography and triangular shadow evaporation technologies (Jpn. J. Appl. Phys., Vol.35, 1996, pp. L1465–L1467). This single-electron transistor has advantages which are not found in silicon-based devices, for example, such as periodical gate modulation characteristic wherein background current does not depend on the gate voltage.

However, the single-electron memory based on the polycrystal Si film is unstable because there are variations in the Si film thickness. Also the Al-based single-electron transistor operates at 100 K, far below the room temperature, and is not of practical use.

SUMMARY OF THE INVENTION

Thus, an object of the present invention is to provide a quantum device which operates stably at the normal temperature and is applicable for commercial production of single-electron transistor and single-electron memory.

Another object of the present invention is to provide extremely small devices such as diode, transistor and semiconductor light emitting devices doped with extremely small amounts of impurities, not experienced in the prior art, by utilizing microscopic dots arranged in the quantum device.

In order to achieve the above and other objects, the quantum device of the present invention is constituted from a two-dimensional array of quantum dots formed from metal atom aggregates contained in metalloprotein complex arranged on the surface of a substrate having an insulation layer at least on the surface thereof with a pitch of the size of the metalloprotein complex.

The metal which constitutes the metal atom aggregates used in the quantum device is preferably one that can ionize in an aqueous solution. For example, the metal may be iron Fe, aluminum Al, phosphorus P, germanium Ge, zinc Zn, manganese Mn, arsenic As, gold Au, silver Ag, tungsten W or the like, while Fe is preferable.

The diameter of the metal atom aggregates used in the quantum device is 7 nm or smaller, preferably 5 nm or smaller, and the pitch of the metalloprotein complex is preferably from 11 to 14 nm.

In a method appropriate for manufacturing the quantum device of the present invention, first the metalloprotein complex is let be adsorbed onto a denatured protein membrane, polypeptide membrane or LB membrane developed on the surface of an aqueous solution. The membrane is then placed on a substrate which is durable to temperatures beyond the burn-out temperature of the protein and has an insulating property on the surface thereof, to burn out the protein component in a gas atmosphere which does not react with the substrate. The metalloprotein complex is turned into a metal oxide and remains on the substrate in a pattern of dots spaced by a pitch of the size of the protein molecule. Then the metal oxide is heated in a reducing atmosphere to be reduced. The metal oxide is thus reduced into metal atom aggregates which are arranged in a two-dimensional array on the substrate.

The metalloprotein complex used in the quantum device of the present invention is preferably ferritin, but the protein may also be one derived from phage or virus.

As the substrate used in the quantum device of the present invention, silicon substrate has wide applicability but glass substrate or ceramic substrate may also be used.

A single-electron transistor of the present invention is constituted from quantum dots which are formed from metal atom aggregates contained in metalloprotein complex and arrayed in two-dimensional configuration with a pitch of the size of the metalloprotein complex on the surface of a substrate which is durable to temperatures beyond the burnout temperatures of the protein and has an insulation layer on the surface thereof, and comprises a quantum well made of first quantum dot, an electrode section made from at least three quantum dots located around the quantum well and a wiring section which connects the quantum dots other than those around the quantum well and the electrode section, wherein the electrode section has a source and a drain comprising second quantum dots and third quantum dots, respectively, which oppose each other, and a control gate comprising fourth quantum dots that remain.

The metal used in the metal atom aggregates, the metalloprotein complex and the substrate of the single-electron transistor may be the same as those used in the quantum device described above.

The diameter of the metal atom aggregate used in the single-electron transistor is 7 nm or smaller, or preferably 5 nm or smaller, which means that one aggregate normally comprises several thousands of atoms, depending on the metal element. As a consequence, the transition level nearest to the Fermi level of the aggregate is higher than the thermal excitation level of electron at room temperature. The quantum well and the electrode section are separated by a distance of 11 to 14 nm which allows the tunnel effect to occur. Therefore, the tunnel effect can be observed in the single-electron transistor at the room temperature or at around the temperature of liquid nitrogen.

An appropriate method for manufacturing the quantum transistor of the present invention comprises, in addition to the steps of manufacturing the quantum device described above, a step of irradiating the metal atom aggregates with electron beam of a scanning electron microscope, of which beam width is set to be not greater than the pitch, in vacuum in the presence of a trace of carbon compound, while scanning the electron beam to have carbon vapor-deposited between the metal atom aggregates thereby forming lead wires. This causes the source and the drain to be connected with the quantum dots other than those around the quantum well by carbon wires. The source of carbon supply may be the residual gas consisting mainly of hydrocarbons coming from vacuum pump oil. This wiring method, which makes it possible to make extremely fine wires spaced by a distance of the order of nanometers, is best suited to the manufacture of microscopic devices such as single-electron transistor.

A diode of the present invention has quantum dots formed from metal atom aggregates wherein donor impurities and acceptor impurities formed from metal atom aggregates contained in metalloprotein complex hetero-dimer are arrayed with a pitch of the size of the metalloprotein complex on the surface of a substrate having an insulation layer on the surface thereof, and has an n-type region, a p-type region and a pn junction formed by diffusing the donor impurities and the acceptor impurities via the insulation layer into the substrate, an electrode section formed in a specified configuration and a wiring section which connects the n-type region, the p-type region and the electrode section.

An appropriate method of fabricating the diode of the present invention comprises the step of arraying donor impurities and acceptor impurities with a pitch of the size of the metalloprotein complex on the surface of the substrate, comprising the steps of (a) fabricating a metalloprotein complex hetero-dimer which includes the donor impurities and the acceptor impurities formed from metal atom aggregates; (b) adsorbing a metalloprotein complex hetero-dimer onto an LB membrane developed on the surface of an aqueous solution; (c) placing the LB membrane having the metalloprotein complex hetero-dimer adsorbed thereon on a substrate which is durable to temperatures beyond the burn-out temperature of the protein and has an insulation layer on the surface thereof, and burning out the protein through heat treatment in an inert gas that does not react with the substrate; and (d) reducing in a reducing atmosphere thereby to obtain metal atom aggregates; and (e) forming the n-type region, the p-type region and the pn junction by diffusing the donor impurities and the acceptor impurities via the insulation layer into the substrate by heat treatment; (f) forming the electrode section by patterning electrodes of a specified configuration; and (g) irradiating the n-type region, the p-type region and the electrode section with electron beam of a scanning electron microscope, of which beam width is set to be not greater than the pitch, in vacuum in the presence of a trace of carbon compound, while scanning the electron beam to have carbon vapor-deposited between the n-type region and the electrode section, and between the p-type region and the electrode section, thereby forming lead wires.

A transistor of the present invention has quantum dots comprising metal atom aggregates and donor impurities or acceptor impurities formed from metal atom aggregates contained in metalloprotein complex hetero-trimer which are arrayed with a pitch of the size of the metalloprotein complex, while a group of impurities capable of forming npn structure formed from acceptor impurities having donor impurities on both sides thereof or a group of impurities capable of forming pnp structure formed from donor impurities having acceptor impurities on both sides thereof is arranged on the surface of the substrate, so that the n-type region, the p-type region and the pn junction formed by diffusing the donor impurities and the acceptor impurities via the insulation layer into the substrate, the electrode section formed in a specified configuration, and the wiring section connecting the n-type region, the p-type region and the electrode section are provided.

A manufacturing method appropriate for the transistor of the present invention comprises the step of arranging donor impurities and acceptor impurities on the surface of a substrate with a pitch of the size of the metalloprotein complex, comprising the steps of (a) fabricating metalloprotein complex hetero-trimer by holding the acceptor impurities or the donor impurities on both sides of the donor impurity and the acceptor impurity formed from metal atom aggregates; (b) adsorbing a metalloprotein complex hetero-trimer onto an LB membrane developed on the surface of an aqueous solution; (c) placing the LB membrane having the metalloprotein complex hetero-trimer adsorbed thereon on a substrate which is durable to temperatures beyond the burn-out temperature of the protein; (d) burning out the protein through heat treatment in an inert gas that does not react with the substrate; and (e) reducing the metalloprotein complex in a reducing atmosphere, and (f) forming the n-type region, the p-type region and the pn junction by diffusing the donor impurities and the acceptor impurities via the insulation layer into the substrate by heat treatment; (g) forming an electrode section of a specified configuration; and (h) irradiating the n-type region, the p-type region, the pn junction and the electrode section with electron beam of a scanning electron microscope, of which beam width is set to be not greater than the pitch, in vacuum in the presence of a trace of carbon compound, while scanning the electron beam to have carbon vapor-deposited between the n-type region and the electrode section, and between the p-type region and the electrode section, thereby forming lead wires.

The metal used in the metal atom aggregates, the metalloprotein complex and the substrate of the diode and the transistor may be the same as those used in the quantum device described above, and the diameter of the metal atom aggregate is similarly 7 nm or smaller, or preferably 5 nm or smaller.

The manufacturing method appropriate for the diode and the transistor is different from the manufacturing method for the single-electron transistor, in that two or three kinds of metalloprotein complex of different metal elements are combined and adsorbed onto the substrate in the form of hetero-dimer or hetero-trimer, and that the donor impurities and the acceptor impurities are diffused by heating to a temperature from 1000 to 1200° C.

The diode and the transistor thus obtained measure about 10 nm by 30 nm, and is expected to operate at an extremely high speed.

A transistor array of the present invention comprises transistors arranged in a two-dimensional array at intervals of an integer number times the pitch, which is from 11 to 14 nm, wherein quantum dots comprise metal atom aggregates contained in metalloprotein complex hetero-trimer having at least one layer of apoprotein in the surrounding thereof with donor impurities or acceptor impurities formed from metal atom aggregates being arranged with a pitch of the size of the metalloprotein complex, while a group of impurities capable of forming npn structure formed from acceptor impurities having donor impurities on both sides thereof or a group of impurities capable of forming pnp structure formed from donor impurities having acceptor impurities on both sides thereof is arranged on the surface of the substrate, the transistor having an n-type region, a p-type region and a pn junction formed by diffusing the donor impurities and the acceptor impurities via an insulation layer into the substrate, an electrode section formed in a specified configuration and a wiring section for connecting the n-type region, the p-type region and the electrode section.

A manufacturing method appropriate for the transistor array of the present invention is basically similar to that of the method of manufacturing the transistor described above, although different in that the hetero-trimer is adsorbed onto the substrate while being surrounded by a multitude of protein molecules which do not include metals, for example a multitude of apoferritin molecules. Both the protein comprising metalloprotein complex and the protein such as apoferritin are burned out. Finally, the acceptor impurities and the donor impurities are arranged at a pitch of the size of the protein, while a group of impurities and a group of other impurities originating from one hetero-trimer are arranged at intervals an integer n times the size of the protein which is from 11 to 14 nm. The integer n can be controlled in terms of the number of protein layers which surround the hetero-trimer.

Because the transistor array of the present invention has transistors arranged at intervals of the order of nanometers, around ten billion transistors per square centimeter can be packaged on a chip, making it possible to achieve an amplifier of high gain.

The manufacturing method appropriate for microscopic dots of the order of nanometers having quantum effects, comprises the steps of arranging quantum dots formed from a plurality of metal atom aggregates contained in metalloprotein complex in two-dimensional configuration on a surface of a substrate having an insulation layer with a pitch of the size of said metalloprotein complex, and forming column shaped structures on the surface of said substrate by plasma etching via said masking quantum dots, and insulating a space between said column shaped structures.

A semiconductor light emitting device of the present invention has p-type and n-type semiconductor layers and an activation layer formed on an insulating substrate, wherein masking quantum dots formed from a plurality of metal atom aggregates contained in metalloprotein complex are arranged in a two-dimensional array on the surface of the activation layer with a pitch of the size of the metalloprotein complex, and quantum dots formed from the activation layer are formed by plasma etching via the masking quantum dots.

A manufacturing method appropriate for the semiconductor light emitting device of the present invention is different from the method of manufacturing the quantum device described above only in that the quantum dots are arrayed on the surface of a light emitting layer laminated on the insulating substrate, while the step of forming the quantum dots from the activation layer by plasma etching is included with the arrayed quantum dots being used as the mask.

The metal contained in the metal atom aggregates, the metalloprotein complex and the substrate used in the semiconductor light emitting device may be the same as those used in the quantum device described above, and diameter of the metal atom aggregate is similarly 7 nm or smaller, or preferably 5 nm or smaller.

BRIEF DESCRIPTION OF THE DRAWINGS

The above and other objects and features of the present invention will become more apparent from the following description of preferred embodiments thereof with reference to the accompanying drawings, throughout which like parts are designated by like reference numerals.

DESCRIPTION OF THE PREFERRED EMBODIMENTS

This application is based on application No.9-157436 filed May 30, 1997 in Japan, the content of which is incorporated hereinto by reference.

Preferred embodiments of the quantum device and the device employing the same according to the present invention will now be described below with reference to the accompanying drawings.

Embodiment 1

Figure 1:
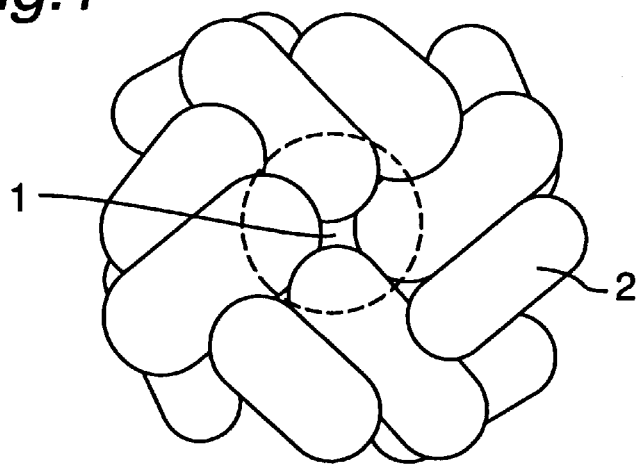
FIG. 1 is a schematic diagram showing the ferritin structure according to the present invention.

The first embodiment of the present invention is an example of method for manufacturing the quantum device. A solution of ferritin is prepared. Ferritin is a metalloprotein complex comprising a core 1 of $Fe_2O_3$ enclosed in a shell 2 of protein as shown in FIG. 1, which can be extracted from organs such as spleen and liver of animals such as horse and cow. The core 1 has a diameter about 6 nm, and includes from 1000 to 3000 iron atoms. The shell 2 is a trisoctamer of protein having a molecular weight of about 20,000. The trisoctamer measures about 12 nm across.

Figure 2A:
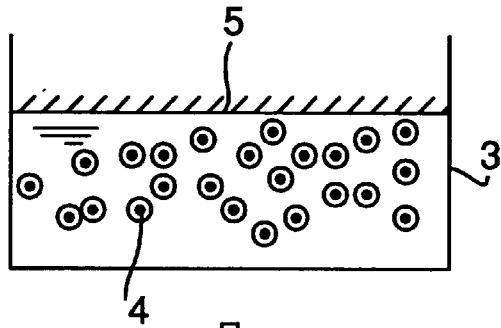
FIG. 2A is a schematic diagram showing the step of manufacturing the quantum device of the present invention.
Figure 2D:
FIG. 2D is a schematic diagram showing the step of manufacturing the quantum device of the present invention.
Figure 2B:
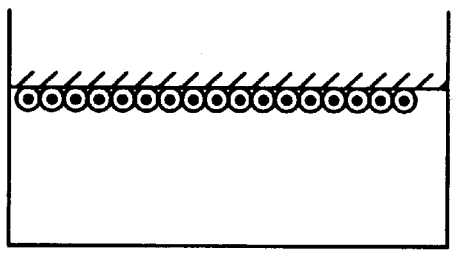
FIG. 2B is a schematic diagram showing the step of manufacturing the quantum device of the present invention.
Figure 2C:
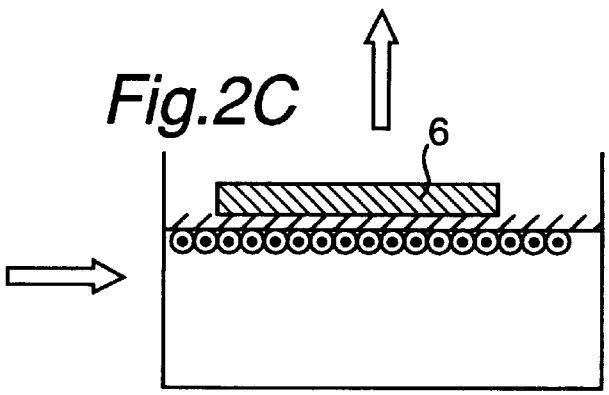
FIG. 2C is a schematic diagram showing the step of manufacturing the quantum device of the present invention.

As shown in FIG. 2A, a tank 3 made of teflon is filled with a buffer liquid wherein ferritin 4 is dispersed and PBLH membrane (polypeptide membrane) 5 is spread on the liquid surface. Hydrogen ion concentration of the liquid is controlled to about pH6 by using a proper acid, for example hydrochloric acid. Because the PBLH membrane 5 is positively charged and the ferritin 4 is negatively charged, ferritin 4 is adsorbed onto the PBLH membrane 5, resulting in a two-dimensional crystal being formed (FIG. 2B). Then after having a silicon substrate 6, which is about 500 $\mu$m thick and is oxidized deep into the surface to have the 2-dimensional crystal deposited on the substrate (FIG. 2C), the substrate is taken out of the tank 3 (FIG. 2D). The substrate is then heat-treated in an inert gas which does not react with the silicon, for example nitrogen, at a temperature of 500° C.

Figure 3:
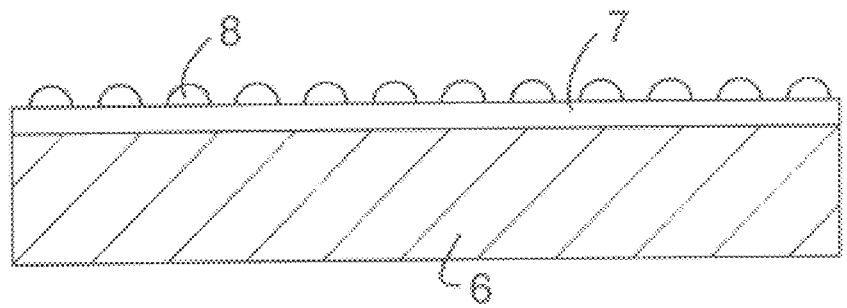
FIG. 3 is a schematic sectional view showing the quantum device on the silicon substrate of the present invention.
Figure 4:
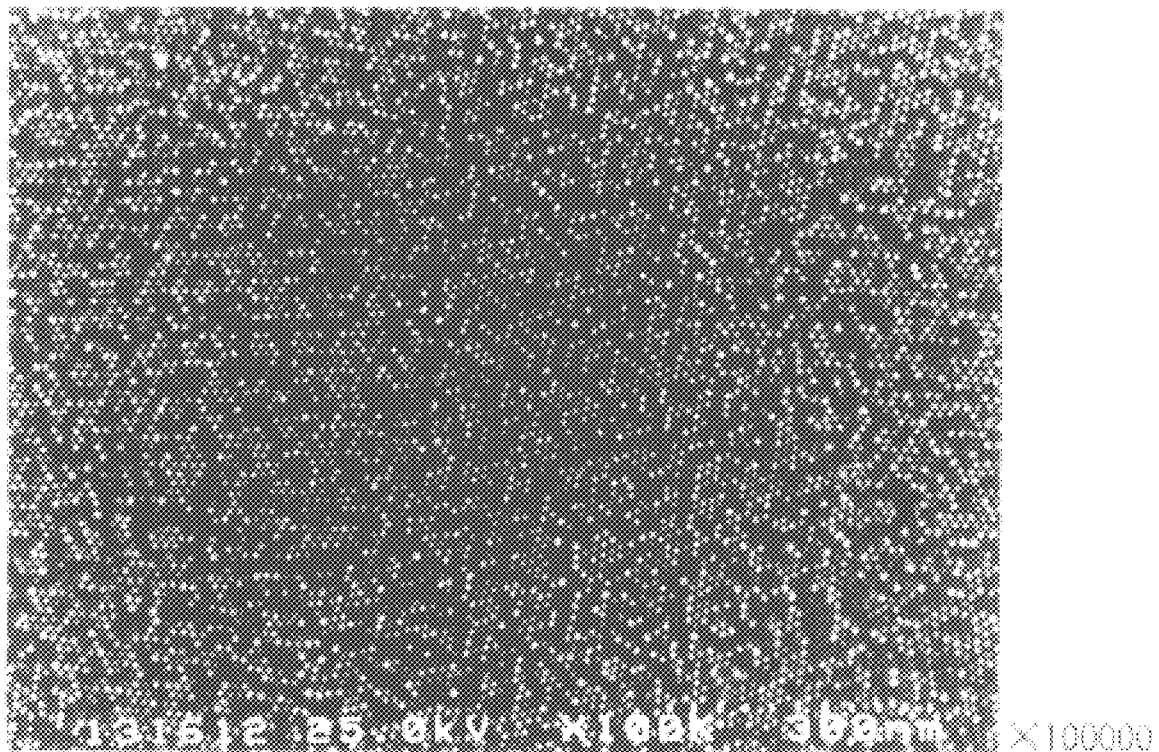
FIG. 4 is a microscope (SEM) photograph of 100,000 times magnification showing the quantum device on the silicon substrate of the present invention.
Figure 5:
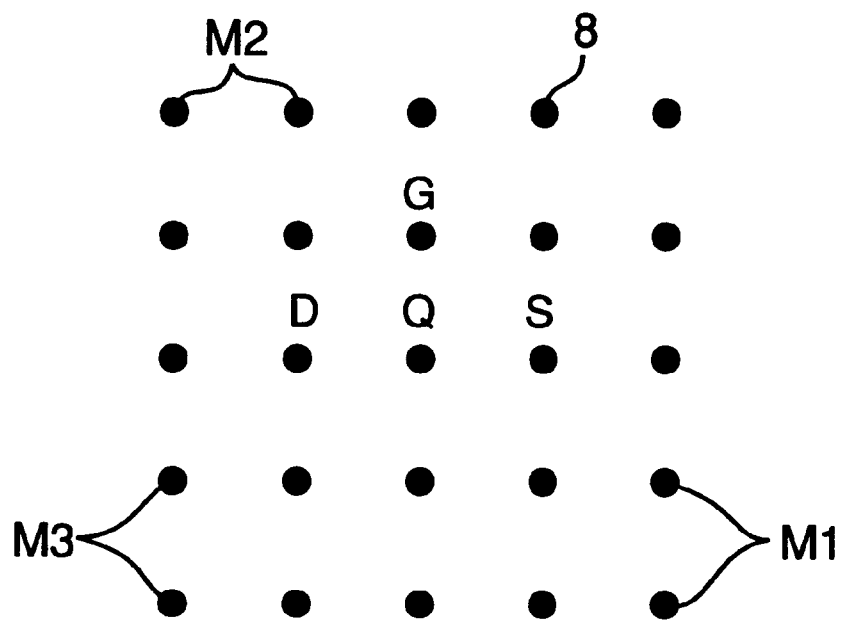
FIG. 5 is a schematic plan view showing the single-electron transistor formed from the quantum device on the silicon substrate of the present invention.

Protein and the PBLH membrane are burned out, leaving $Fe_2O_3$ or other iron oxide 8 arranged two-dimensionally via a thin film 7 of silicon oxide on the substrate, as shown in cross sectional view of FIG. 3. That the iron oxide 8 is arranged two-dimensionally is confirmed through measurement by AFM analysis which shows the iron oxide 8 has only two heights, 5.3 nm and 10.6 nm, and mostly 5.3 nm. SEM photograph (×100,000) of two-dimensional crystal of iron oxide obtained after one hour of eat treatment in nitrogen atmosphere at 500° C. In FIG. 4, many white dots represent the iron oxide and black portions in the surrounding thereof are protein and silicon that remain. When the two-dimensional crystal is subjected to heat treatment again for 60 minutes in a hydrogen atmosphere at 800 to 500° C., a quantum device is obtained comprising a multitude of iron atom aggregates arranged two-dimensionally on the oxide film of the surface of the silicon substrate 6. The diameter of the aggregate is about 6 nm, the same as that of the core of iron oxide contained in ferritin, and the pitch between aggregates is about 12 nm, the same as one side of the protein shell of ferritin. As shown in the plan view of FIG. 5, a single-electron transistor is obtained by using one of the aggregates M as a quantum well Q, at least three quantum dots surrounding the quantum well as an electrode, second and third quantum dots which oppose each other interposing the quantum well as a drain D and a sources, respectively, remaining fourth quantum dot in the surrounding as a gate G, and other aggregates M as wiring.

Because the quantum well Q of the single-electron transistor is an aggregate comprising one thousand to three thousand atoms, the transition level nearest to the Fermi level of the quantum well is higher than the thermal excitation level of electrons at room temperature. The quantum well Q, the drain D and the source S are separated by a distance of 12 nm which allows the tunnel effect to occur. Therefore, tunnel effect can be observed in the single-electron transistor at the room temperature or at a practically feasible temperature.

Embodiment 2

This embodiment is an example of wiring method for the quantum device obtained in the first embodiment. The quantum device obtained in the first embodiment is put in the chamber of a field emission scanning electron microscope (FE-SEW, inside of the chamber being pumped vacuum to about $10^{-6}$ Pa. Electron beam with a width being set to about 5 nm is scanned between the drain D, the source S or the gate G and one or more of the iron atom aggregates M1 through M3. This results in a lead wire made of carbon 20 nm wide connecting the drain the source, the gate and the iron atom aggregates M1 through M3 and electrodes M1 through M3 being formed.

Embodiment 3

Figure 6:
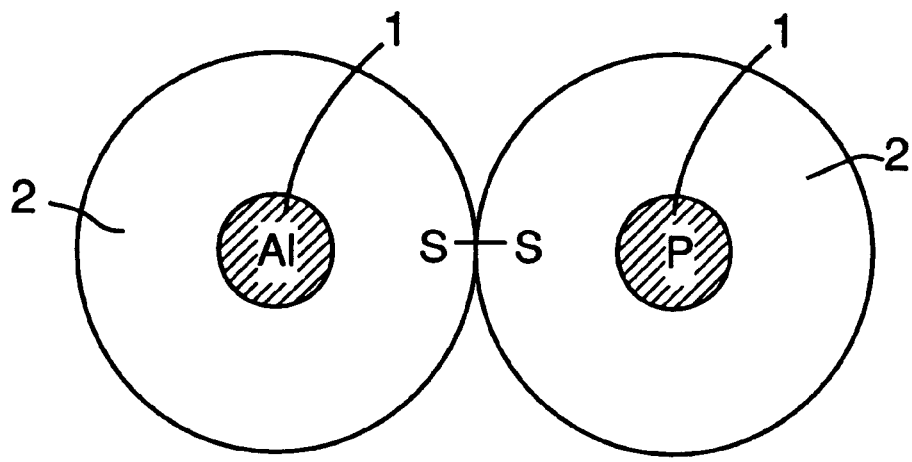
FIG. 6 is a schematic sectional view showing the hetero-dimer of the metalloprotein complex of the present invention.

The third embodiment is an example of the diode of the present invention. A column filled with polystyrene beads of mean diameter 100 $\mu$m having ammonium radical $NH^{4+}$ bonded onto the surface thereof is prepared. Aluminum oxide is put in the position of an apoferritin core, and metal-apoferritin complex thus obtained is passed through the column to be adsorbed onto the polystyrene beads. Then phosphoric acid is put in the position of another apoferritin core, and metal-apoferritin complex thus obtained is passed through the same column to be adsorbed onto the polystyrene beads. The two kinds of metal-apoferritin complex are made to bond by disulfide linkage between sulfur atoms of a cysteine residue of protein, thereby fabricating a hetero-dimer shown in FIG. 6. The hetero-dimer is let flow out of the column into the same tank as that of the first embodiment.

Figure 7:
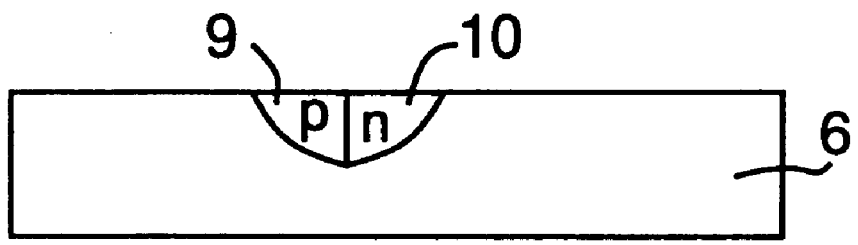
FIG. 7 is a schematic sectional view showing the structure of the diode of the present invention.

Under the same conditions as those of the first embodiment except that the ferritin of the first embodiment is replaced with the hetero-dimer, the two-dimensional crystal is made to deposit on the silicon substrate, protein is burned out and reduced into metal atom aggregate. Aluminum atom aggregate and phosphorus atom aggregate are arranged with a space a 12 nm between the centers thereof on the silicon substrate. This is subjected to heat treatment under the same conditions as those of the first embodiment so that the aluminum atom aggregate and phosphorus atom aggregate are arranged on the silicon substrate, which are subjected to heat treatment at a higher temperature so that the aggregates are diffused into the silicon substrate right below to form n- and p-type semiconductors. Then Al film is formed into a specified configuration by means of photolithography technology or electron beam lithography technology while masking the n- and p-type semiconductors and formed an electrode section. The diode is formed by forming a carbon wire similarly to the second embodiment 2 (FIG. 7). The diode measures 10 nm by 20 nm.

Embodiment 4

The fourth embodiment is an example of the transistor of the present invention. Hetero-dimer is fabricated in a column in the same procedure as that of the third embodiment. Aluminum oxide is put in the position of third apoferritin core, and metal-apoferritin complex thus obtained is passed through the same column to be adsorbed onto the polystyrene beads. Then the hetero-dimer and the metal-apoferritin complex are made to bond by disulfide linkage between sulfur atoms of a cysteine residue of protein, thereby fabricating a hetero-trimer. The hetero-trimer is let flow out of the column into the same tank as that of the first embodiment.

Figure 8:
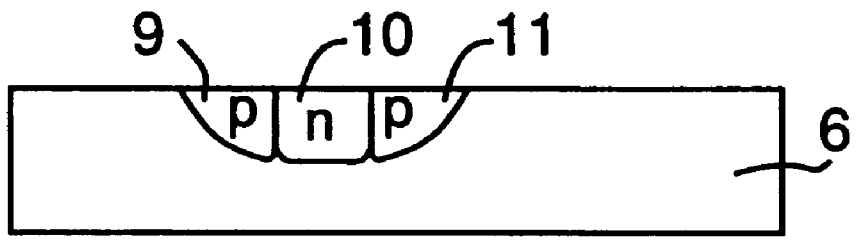
FIG. 8 is a schematic sectional view showing the structure of the transistor of the present invention.

Under the same conditions as those of the first embodiment except that the ferritin of the first embodiment is replaced with the hetero-trimer, the two-dimensional crystal is made to deposit on the silicon substrate, protein is burned out and reduced into metal atom aggregate. Aluminum atom aggregate and phosphorus atom aggregate are arranged with a space of 12 nm between the centers thereof on the silicon substrate. This is subjected to heat treatment under the same conditions as those of the second embodiment so that the aluminum atom aggregate and the phosphorus atom aggregate are diffused into the silicon substrate right below to form p-, n- and p-type semiconductors. Then an electrode section 3 and a carbon wire are formed similarly to the third embodiment (FIG. 8). The transistor measures 10 nm by 30 nm.

Embodiment 5

Figure 9:
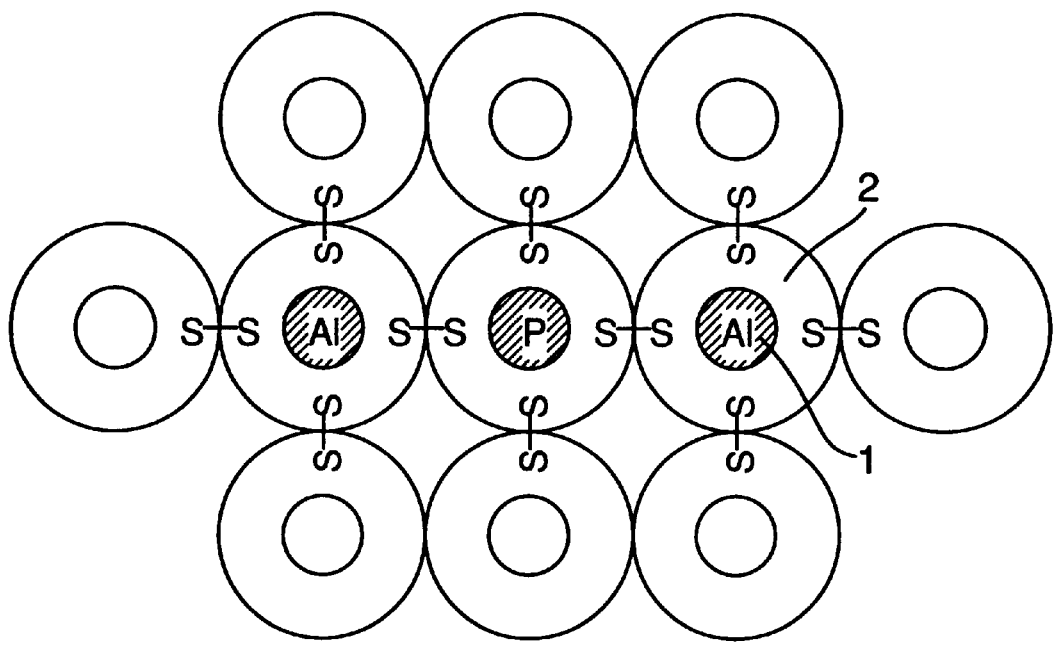
FIG. 9 is a schematic sectional view showing the hetero-trimer surrounded by apoferritin of the present invention.
Figure 10:
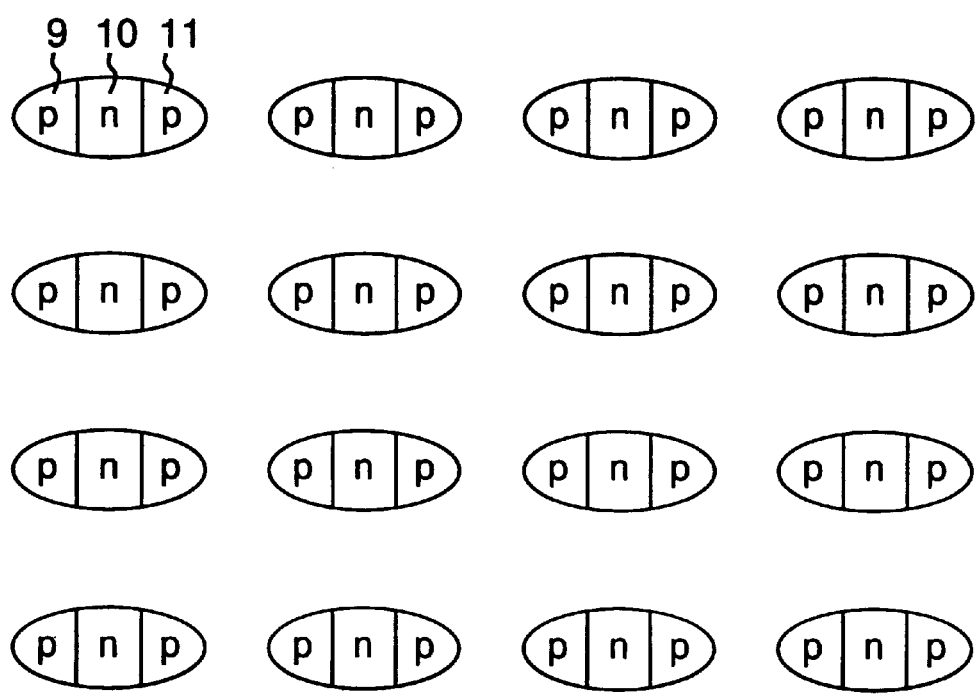
FIG. 10 is a schematic plan view showing the transistor array of the present invention.

The fifth embodiment is an example of the transistor array of the present invention. Hetero-trimer is fabricated in a column in the same process as that of the fourth embodiment. A large amount of apoferritin is passed through the same column to be adsorbed onto the polystyrene beads. Then the hetero-trimer and the apoferritin are made to bond by disulfide linkage between sulfur atoms of a cysteine residue of protein, thereby surrounding the hetero-trimer with a layer comprising a multitude of apoferritin as shown in FIG. 9.

Under the same conditions as those of the first embodiment except that the ferritin of the first embodiment is replaced with the hetero-trimer surrounded by the apoferritin, the two-dimensional crystal is made to deposit on the silicon substrate, protein is burned out and reduced into metal atom aggregate. Aluminum atom aggregate and phosphorus atom aggregate are found to be arranged with a space of 12 nm between the centers thereof on the silicon substrate. This is subjected to another heat treatment under the same conditions as those of the first embodiment so that the aluminum atom aggregate and the phosphorus atom aggregate are arranged on the silicon substrate, which are further subjected to heat treatment at a higher temperature and are diffused into the silicon substrate right below to form n- and p-type semiconductors. These semiconductors function as transistor array, each measuring 10 nm by 30 nm.

Embodiment 6

Figure 11:
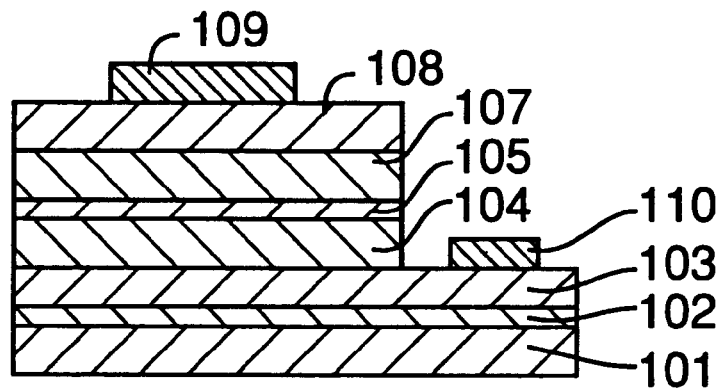
FIG. 11 is a schematic sectional view showing the structure of the semiconductor light emitting device of the present invention.

The sixth embodiment is an example of the semiconductor light emitting device of the present invention which will be described below with reference to FIG. 11. A single crystal sapphire substrate 101 having been cleaned with an organic solvent and heat treatment is set on a susceptor which is put in a reaction chamber of an MOCVD apparatus.

(formation of a buffer layer on a sapphire substrate)

While circulating hydrogen gas through the reaction chamber at normal pressure, the sapphire substrate is etched in gas phase at 1100° C. Then with the temperature being lowered to 400° C., hydrogen gas, ammonia gas and trimethyl aluminum gas are supplied in predetermined proportions, thereby to form a buffer layer 102 comprising AlN.

(Formation of an n-type GaN layer of silicon layer doped with silicon)

With the sapphire substrate 1 maintained at 1150° C., hydrogen gas, ammonia gas, trimethyl aluminum gas and silane gas are supplied in specified proportions, thereby to form a silicon-doped n-type GaN layer 103.

(Formation of an n-type AlGaN clad layer)

With the sapphire substrate 1 maintained at 1150° C., hydrogen gas, ammonia gas, trimethyl gallium gas, trimethyl aluminum gas and silane gas are supplied in specified proportions, thereby to form a silicon-doped n-type AlGaN clad layer 104.

(Formation of light emitting InGaN layer on n-type AlGaN)

With the sapphire substrate 1 maintained at 800° C., hydrogen gas, ammonia gas, trimethyl gallium gas and trimethyl indium gas and silane gas are supplied in specified proportions, thereby to form an InGaN layer 105.

(Formation of two-dimensional crystal membrane on InGaN layer)

A substrate having the InGaN layer as the top layer thereof is floated in a tank wherein a two-dimensional crystal is formed, similarly to the silicon substrate of the first embodiment, and the substrate with the two-dimensional crystal membrane deposited thereon is taken out of the tank. Then the substrate is subjected to heat treatment in an inert gas at 500° C., so that dots of iron oxide 106 are arranged regularly on the InGaN layer 105 at specified intervals.

(Formation of quantum dots of InGaN layer)

The substrate having the dots of iron oxide 106 arranged regularly thereon is subjected to plasma etching by electron cyclotron resonance absorption (ECR), under conditions of introducing $SF_6$ as plasma gas, pressure of about $10^{-2}$ Pa, with microwave applied so that plasma is generated by electron cyclotron resonance absorption. At this time, the substrate is maintained at a low temperature to prevent chemical etching from taking place. While the temperature is preferably −50° C. or lower, it is necessary to determine the optimum temperature taking various influences into consideration and precisely control the substrate temperature, in order to maintain the influence of the plasma state due to the substrate cooling efficiency and vacuum vessel. Through the plasma etching, the iron oxide dots become mask thereby forming circular column structures several nanometers in diameter arranged regularly. Quantum dots are formed by filling the space between the circular column structures with an insulating material such as oxide.

(Formation of a p-type AlGaN layer on quantum dot)

With a sapphire substrate 101 maintained at 1050° C., hydrogen gas, ammonia gas, trimethyl gallium gas, trimethyl aluminum and cyclopentadienyl magnesium are supplied in specified proportions, thereby to form a magnesium-doped p-type AlGaN clad layer 107.

(Formation of a p-type GaN layer on p-type AlGaN layer)

With the sapphire substrate 101 maintained at 1050° C., hydrogen gas, ammonia gas, trimethyl gallium gas, trimethyl aluminum and cyclopentadienyl magnesium are supplied in predetermined proportions, thereby to form a magnesium-doped p-type GaN contact layer 108.

(Formation of electrode)

In a tank maintained at high degree of vacuum, an Ni layer is vapor-deposited on the top surface of the specimen described above, and the Ni layer is formed into a specified configuration by photolithography thereby to form an electrode 109 of p-type GaN. On the other hand, the specimen is etched on the p-type GaN side to expose the n-type GaN layer, and Al layer is vapor-deposited on part of the exposed n-type GaN thereby to form an electrode 110 of n-type GaN.

(Separation of device)

Figure 12:
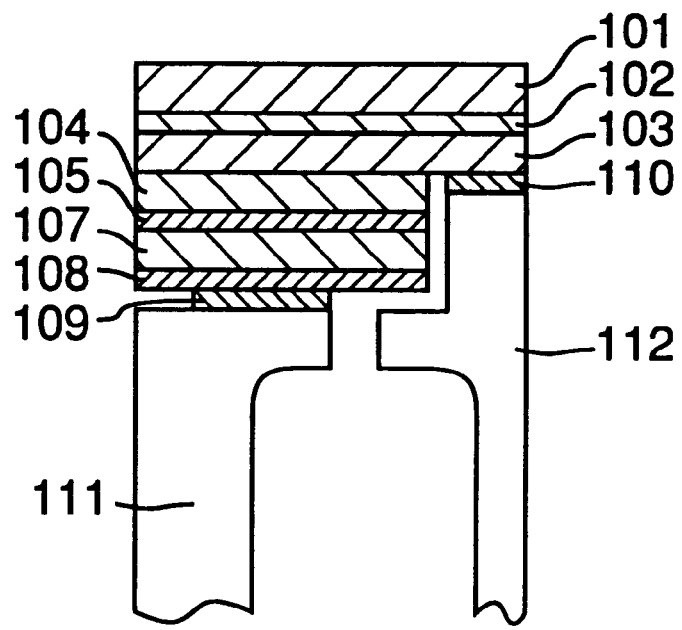
FIG. 12 is a schematic sectional view showing the method of bonding the lead frame member of the semiconductor light emitting device of the present invention.

The wafer formed as described above is cut to a specified size and the electrodes are bonded onto leads 111, 112 of a lead frame thereby to form light emitting devices (FIG. 12).

In the prior art, quantum dots have been formed in the light emitting layer by utilizing the capability of InGaN of the light emitting layer to spontaneously forming quantum dot, but uniform quantum dots cannot be formed. According to the present invention, because of plasma etching employing two-dimensionally arranged dots of iron oxide contained in ferritin as the mask, quantum dots of uniform sizes of nanometer order can be formed, thereby making it possible to improve the internal quantum efficiency and improve the efficiency of emitting blue light.

The quantum device of the present invention has, because microscopic metal atom aggregates are arranged at extremely small intervals and microscopic lead wires can be made by the wiring method of the present invention, application for single-electron transistor, single-electron memory, diode, transistor and semiconductor light emitting device which operate stably at the normal temperature.

What is claimed is:

1. A method of fabricating single-electron transistor comprising quantum dots formed from microscopic metal particles of which transition level nearest to the Fermi level is higher than the thermal excitation level of electron at room temperature, said method comprising the steps of:

(a) adsorbing a metalloprotein complex onto an LB membrane developed on a surface of an aqueous solution;

(b) placing said LB membrane having said metalloprotein complex adsorbed thereon on a substrate which is durable to temperatures beyond the burn-out temperature of said protein and having an insulation layer at least on the surface thereof;

(c) burning out said protein through heat treatment in an inert gas that does not react with said substrate; and (d) reducing said metalloprotein complex thereby to obtain metal atom aggregates; and (e) irradiating said metal atom aggregates with electron beam of a scanning electron microscope, of which beam width is set to be not greater than said pitch, in vacuum in the presence of a trace of carbon compound, while scanning said electron beam to have carbon vapor-deposited between said metal atom aggregates thereby forming lead wires.

2. The method according to claim 1, further comprising the step of adsorbing ferritin as said metalloprotein complex onto an LB membrane developed on the surface of an aqueous solution.

* * * * *